United States Patent
Condemi et al.

(10) Patent No.: US 6,310,801 B1
(45) Date of Patent: Oct. 30, 2001

(54) METHOD AND DEVICE FOR FAST ADDRESSING REDUNDANT COLUMNS IN A NONVOLATILE MEMORY

(75) Inventors: Carmelo Condemi; Michele La Placa, both of Gravina di Catania; Ignazio Martines, Catania, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/548,783

(22) Filed: Apr. 13, 2000

(30) Foreign Application Priority Data

Apr. 13, 1999 (IT) ............................................... TO99A0289

(51) Int. Cl.$^7$ ..................................................... G11C 16/24
(52) U.S. Cl. ................................ 365/185.25; 365/185.09; 365/185.08; 365/189.07; 365/189.08; 365/195; 365/204; 365/230.08; 365/233.5
(58) Field of Search ......................... 365/185.25, 185.09, 365/185.08, 233.5, 189.07, 195, 189.08, 204, 230.08

(56) References Cited

U.S. PATENT DOCUMENTS 5,260,904 * 11/1993 Miyawaki et al. ............... 365/189.06
5,608,681 * 3/1997 Priebe et al. ......................... 365/207

OTHER PUBLICATIONS

Jian Chen et al., "Study of Over Erase Correction Conversence Point Vth in Flash Eprom Cell", AMD Technology Conference, 1994, pp. 68–69.*

* cited by examiner

Primary Examiner—Andrew Q. Tran
(74) Attorney, Agent, or Firm—Theodore E. Galanthay; Robert Iannucci; Seed IP Law Group PLLC

(57) ABSTRACT

A method for addressing redundant columns in a nonvolatile memory, which receives, at inputs, selection addresses and comprises a plurality of redundant columns, each including a respective bit line and a plurality of memory cells connected to the bit line. The addressing method comprises the steps of: detecting a transition in the selection addresses; starting charging of all the bit lines upon detection of the transition in the addresses; then detecting whether one of the redundant columns is addressed; should one of the redundant columns be found to be addressed, proceeding with charging of the bit line of the redundant column addressed and interrupting charging of the bit lines of the redundant columns not addressed; and should none of the redundant columns be found to be addressed, interrupting charging of all the bit lines.

17 Claims, 3 Drawing Sheets

METHOD AND DEVICE FOR FAST ADDRESSING REDUNDANT COLUMNS IN A NONVOLATILE MEMORY

TECHNICAL FIELD

The present invention regards a method and a device for fast addressing of redundant columns in a nonvolatile memory.

BACKGROUND OF THE INVENTION

As is known, certain types of volatile memory (EPROM, EEPROM, Flash, etc.) enable replacement of faulty rows or columns of the memory array with others, referred to as "redundant" ones, in order to restore complete functionality of the memory array. In this case, the information on the presence of faulty rows or columns and on their position is stored in non-erasable memory cells known as CAM cells, which are read in the so-called phase of memory "power-up", i.e., in the phase during which the supply voltage is supplied.

FIG. 1 illustrates a device for addressing redundant columns, which is widely used in nonvolatile memories.

The addressing device, designated as a whole by 1, comprises a plurality of addressing circuits 2, one for each redundant column to be addressed, only one of which being illustrated in FIG. 1 and being described in what follows.

The addressing circuit 2 comprises a detecting stage 3 receiving at inputs the addresses supplied to the memory and having the purpose of verifying whether a transition has occurred in said addresses, and supplying at outputs a masking control signal ATD and a discharging control signal PH.

In particular, the masking control signal ATD has a low-to-high logic level switching edge when a transition is detected in the addresses and a subsequent high-to-low logic level switching edge delayed with respect to the former switching edge by a preset length of time sufficient to enable the addresses to propagate within the addressing circuit 1, as described more fully in what follows.

The discharging control signal PH is instead obtained by inverting the masking control signal ATD and delaying the second switching edge by a preset amount Δ with respect to the second edge of the masking control signal ATD, the meaning of which will be clarified below.

The addressing circuit 2 further comprises a comparator stage 4 having the purpose of verifying whether the redundant column has been addressed. In particular, the comparator stage 4 receives at inputs the address ADI of the column of the array addressed and the address ADF of a respective redundant column of which it controls the addressing, compares one by one the n bits of the address ADI of the column addressed with the respective n bits of the address ADF of the redundant column, and supplies at output n status signals COMP[1 . . . n] of a logic type each indicating the outcome of the comparison made on a respective pair of bits: if the redundant column has been addressed, all the status signals COMP[1 . . . n] assume a low logic level whereas if the redundant has not been addressed, at least one of the status signals COMP[1 . . . n] assumes a high logic level.

The addressing circuit 2 further comprises a masking stage 5 formed of n NMOS masking transistors 6 (only one of which illustrated in the figure) each presenting a drain terminal connected to a respective output of the comparator stage 4 and receiving a respective status signal COMP[1 . . . n], a source terminal connected to ground and a gate terminal receiving the masking control signal ATD.

The addressing circuit 2 further comprises a discharging stage 8 formed of n NMOS discharging transistors 10 having drain terminals connected to one and the same common node 12, source terminals connected to ground and gate terminals connected to respective outputs of the comparator stage 4 and receiving respective status signals COMP[1 . . . n].

The addressing circuit 2 further comprises a precharging stage 14 comprising an NMOS pull-down transistor 16 and a PMOS pull-up transistor 18. In particular, the pull-down transistors 16 and pull-up transistor 18 have drain terminals connected together and to the common node 12, source terminals connected to a supply line 20 and, respectively, to ground, and gate terminals connected together and receiving the discharging control signal PH.

The addressing circuit 2 further comprises a storage stage 22 storing the logic level of the common node 12, this stage being basically made up of a latch having an input terminal connected to the common node 12, an output terminal on which it supplies the logic level of the common node 12, and a control terminal receiving the discharging control signal PH.

The addressing circuit 2 further comprises a final stage 24 comprising a NOR logic gate 26 having a first input connected to the output of the storage stage 22; a second input connected to the output of a NOT logic gate 28 on the input of which is supplied the discharging control signal PH; and an output on which an addressing signal YMi is supplied for the respective redundant column.

The addressing signal YMi is then supplied, as illustrated in FIG. 2, to a gate terminal of a respective NMOS selection transistor 30 arranged between the bit line 32 of the respective redundant column 34, to which are connected the drain terminals of the memory cells of that column (the drain capacitances of which are represented schematically in the figure by an equivalent capacitor 36), and a sense amplifier 38 responsible for precharging the bit lines 32 of the redundant columns 34.

The addressing phase of a redundant column 34 will now be described with reference to FIG. 3, which illustrates the plots versus time of the status signal COMP [1 . . . n], the masking control signal ATD, the discharging control signal PH, and the addressing signal YMi, as well as of the voltages of the common node 12, indicated by VW, of the bit line 32 of the redundant column addressed, and of a bit line of a non-redundant column, indicated respectively by VCR and VCS, following upon a transition of the addresses supplied as input to the memory array.

As illustrated in FIG. 3, upon transition in the addresses supplied as input to the memory array, the masking control signal ATD switches from the low logic level to the high logic level, whilst the discharging control signal PH switches from the high logic level to the low logic level.

The masking control signal ATD, set at the high logic level, turns on the masking transistors 6 (so as to bring them into the triode region), thus imposing on the outputs of the comparator stage 4 a low logic level and hence, in practice, masking the outcome of the comparison.

Simultaneously, the discharging control signal PH at the low logic level turns on the pull-up transistor 18 and turns off the pull-down transistor 16 of the precharging stage 14, thus bringing about charging of the common node 12, the voltage VW of which, as a result, switches rapidly from a low logic level to a high logic level and, through the NOT logic gate 28 and the NOR logic gate 26, maintains the addressing signal YMi at the low logic level regardless of the logic level supplied at output from the storage stage 22.

In addition, with a slight delay with respect to the transition in the addresses, the bit lines of the non-redundant columns addressed start to charge and their voltage VCS starts to increase towards the final value to which they must be precharged.

The masking control signal ATD remains at the high logic level for a time long enough for the addresses to be propagated up to the comparator stage 4, and then switches to the low logic level.

When the masking control signal ATD switches from the high logic level to the low logic level, the masking transistors 6 are turned off, the outputs of the comparator stage 4 are no longer bound to the low logic level, and the status signals COMP[1 . . . n] are free to evolve towards the logic level corresponding to the outcome of the comparison.

At this point, if addressing of a redundant column 34 does not correspond to the transition of the addresses, then at least one of the status signals COMP [1 . . . n] switches from the low logic level to the high logic level (illustrated in FIG. 3 by a heavy line) and turns on the corresponding discharging transistor 10, the latter discharging the common node 12 in a certain time, while its voltage VW passes from the high logic level to the low logic level (illustrated in FIG. 3 by a heavy line).

If, instead, addressing of a redundant column 34 corresponds to the transition of the addresses, then all the status signals COMP [1 . . . n] remain at the low logic level (indicated in FIG. 3 with a dashed line), none of the discharging transistors 10 is thus turned on and hence the common node 12 is not discharged; consequently the voltage VW of the common node 12 remains at the high logic level (indicated in FIG. 3 by a dashed line).

Once a delay time Δ from switching of the masking control signal ATD from the high logic level to the low logic level has elapsed, the discharging control signal PH switches once again to the high logic level.

The delay Δ between the switching of the masking control signal ATD from the high logic level to the low logic level and the switching of the discharging control signal PH from the high logic level to the low logic level is determined in such a way as to enable the common node 12 to be discharged and brought to a low logic level even in the worst case in which only one of the discharging transistors 10 is turned on.

Switching of the discharging control signal PH to the high logic level thus controls the storage of the logic level of the common node 12 within the storage stage 22 and subsequently turns off the pull-up transistor 18 and turns on the pull-down transistor 16 of the precharging stage 14, so causing discharging of the common node 12, the voltage VW of which as a result switches rapidly from the high logic level to the low logic level (as indicated in FIG. 3 by the dashed line).

In addition, the discharging control signal PH at the high logic level enables the addressing signal YMi to evolve towards the logic level corresponding to the logic level supplied at its output from the storage stage 22. In particular, in the case where one of the redundant columns 34 is addressed, the corresponding bit line 32 starts to charge and its voltage VCR starts to increase towards the final value at which it must be precharged.

As may be noted from what has been described above, addressing of the redundant columns 34 occurs with a delay with respect to addressing of the non-redundant columns, which at best will at least be equal to the delay Δ described above.

SUMMARY OF THE INVENTION

An embodiment of the present invention provides a method and a device that enable addressing of redundant columns faster than that of the known devices.

The method addresses a redundant column in a nonvolatile memory, which receives, at inputs, selection addresses. Each redundant column includes a respective bit line and a plurality of memory cells connected to the bit line. The addressing method comprises the steps of: detecting a transition in the selection addresses; starting charging of all the bit lines upon detection of the variation in the addresses; then detecting whether one of the redundant columns is addressed. If one of the redundant columns is found to be addressed, then the method proceeds with charging of the bit line of the redundant column addressed and interrupts charging of the bit lines of the redundant columns not addressed. If none of the redundant columns is found to be addressed, then the method interrupts charging of all the bit lines.

BRIEF DESCRIPTION OF THE DRAWINGS

For a better understanding of the present invention, a preferred embodiment is now described, purely to provide a non-limiting example thereof, with reference to the attached drawings, in which.

DETAILED DESCRIPTION OF THE INVENTION

Figure 4:
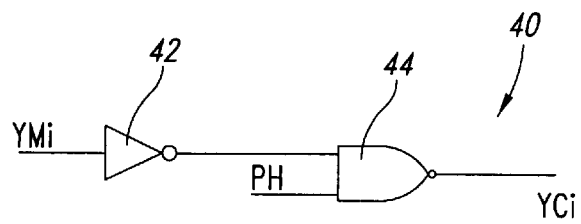
FIG. 4 shows a circuit diagram according to an embodiment of the present invention.

An addressing device 1' according to an embodiment of the present invention is shown in FIG. 4. The addressing device 1' starts precharging of all the bit lines 32 of the redundant columns 34 upon detection of the transition in the addresses.

In this way, when the precharging and evaluation phase is ended, only the selection transistor 30 of the bit line 32 of the redundant column 34 actually addressed will continue to be turned on and hence this bit line 32 will continue its charging, starting from a value very close to the final one to which it must be precharged, whilst the selection transistors 30 of the other bit lines 32 are turned off, and hence said bit lines 32, as they remain floating, tend to discharge.

In this way, the charging of the bit line 32 of the redundant column 34 actually addressed ends in much shorter times than the times involved when an addressing circuit of the known type is used, in that it is not carried out starting from a zero value but from a value very close to the final one.

Charging of all the bit lines 32 of the redundant columns 34 is carried out by conditioning all the addressing signals YMi with the discharging control signal PH to generate conditioned addressing signals YCi having a high logic level during the precharging and evaluation phase, so as to turn on all the selection transistors 30 and thus determine simultaneous charging of all the bit lines 32, and to a low logic level at the end of the precharging and evaluation phase.

Figure 1:
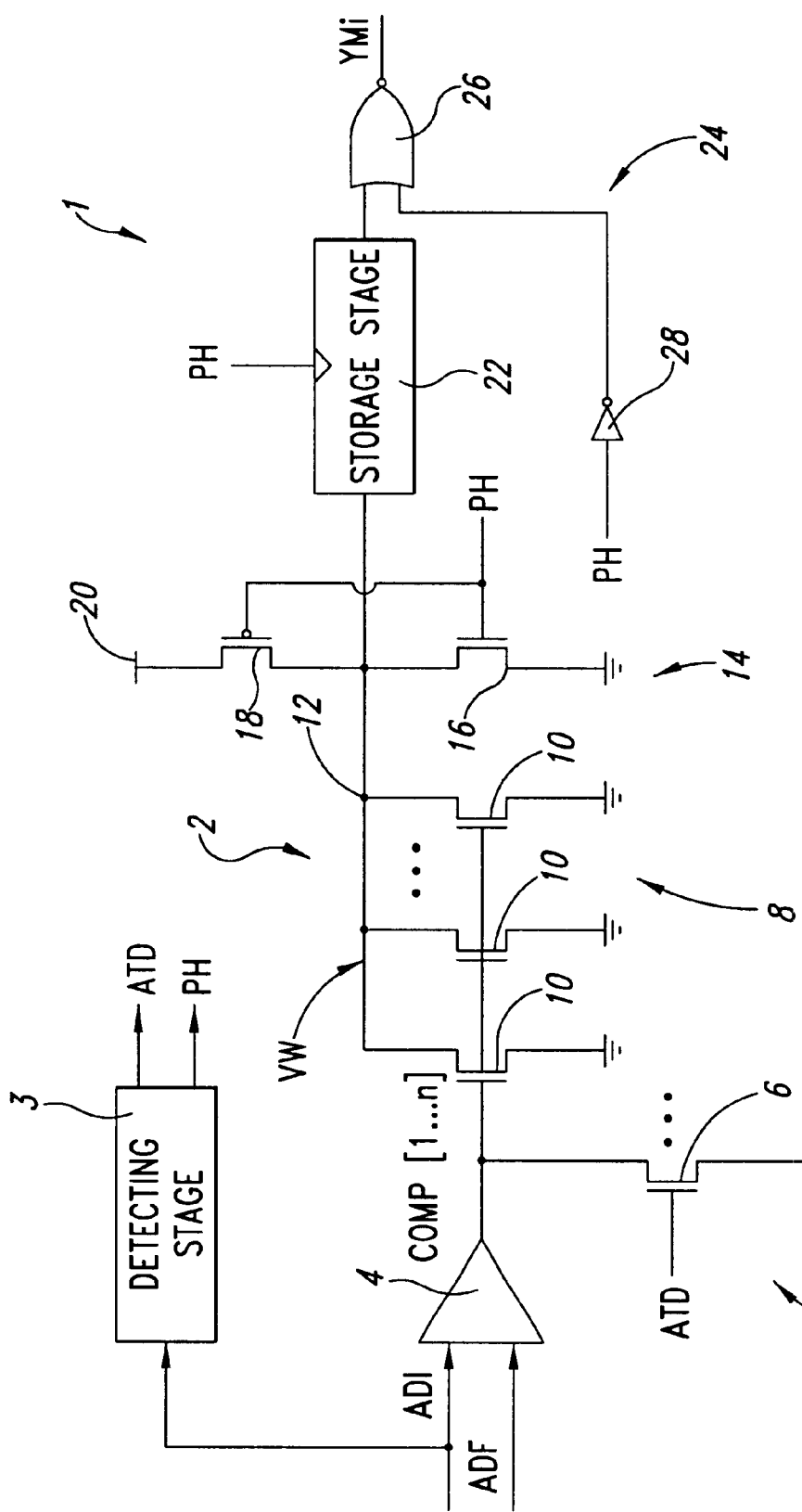
FIG. 1 shows the circuit diagram of a known circuit for addressing redundant columns.

In particular, charging of all the bit lines 32 of the redundant columns 34 is carried out using the addressing device 1' shown in FIG. 4. The addressing device 1' differs from the addressing device 1 in that the addressing circuits of the addressing device 1' illustrated in FIG. 1 further comprise a conditioning stage 40 illustrated in FIG. 4, cascaded to the final stage 24.

Figure 2:
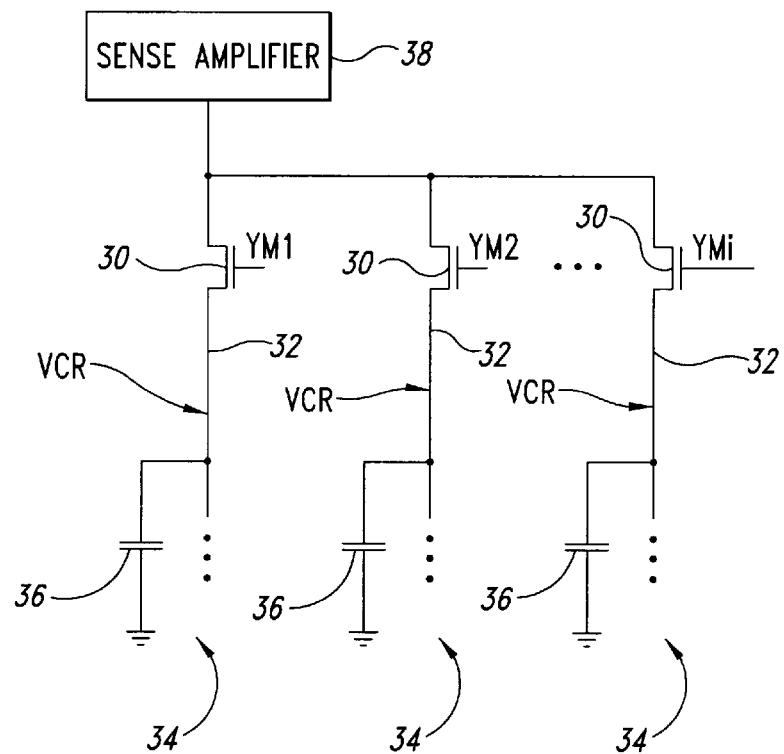
FIG. 2 shows the circuit diagram of a known circuit for precharging and selecting redundant columns.

In detail, the conditioning stage 40 comprises a NOT logic gate 42 having an input connected to the output of the NOR logic gate 26 and an output connected to a first input of a NAND logic gate 44, which further presents a second input receiving the discharging control signal PH and an output on which it supplies a conditioned addressing signal YCi supplied to a respective selection transistor 30 (FIG. 2).

Figure 3:
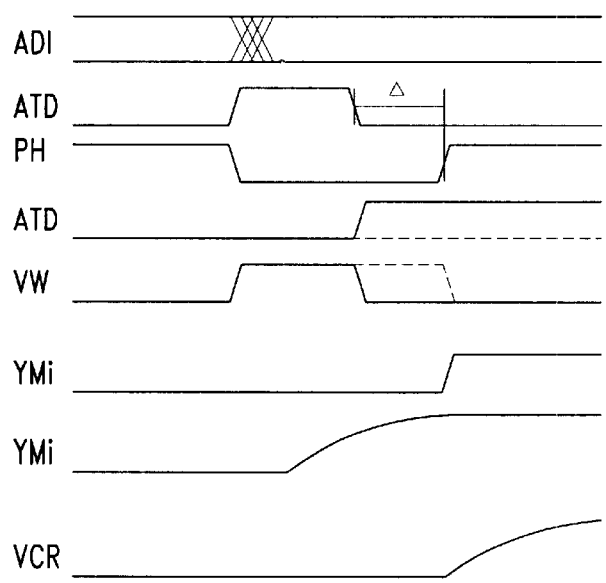
FIG. 3 shows known plots versus time of signals corresponding to the addressing circuit of FIG. 1.
Figure 5:
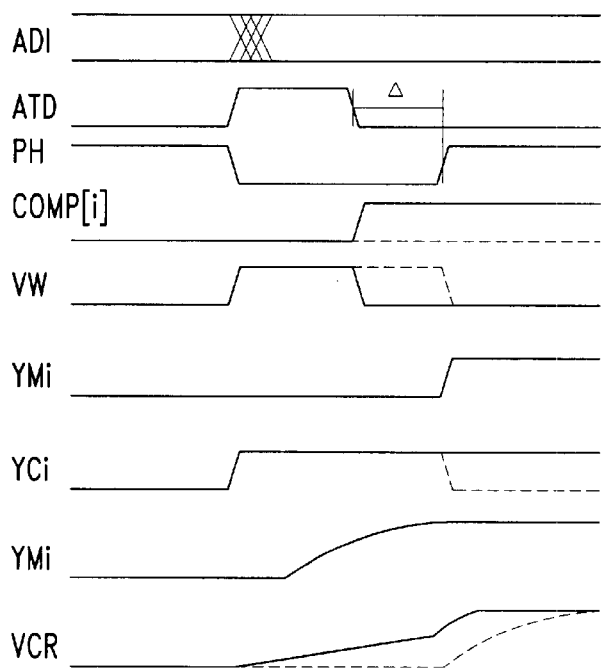
FIG. 5 shows plots versus time obtainable with the addressing circuit according to the present invention.

The difference in operation between an addressing device 1' shown in FIG. 4 as compared to the addressing device 1 is highlighted in FIG. 5, where the plots versus time of the same signals illustrated in FIG. 3 are illustrated, but this time for the addressing device 1'.

In fact, as may be noted, as long as the discharging control signal PH is at the low logic level, all of the conditioned addressing signals YCi are kept at a high logic level and consequently turn on all the selection transistors 30. All the bit lines 32 of the redundant columns 34 are thus connected to the sense amplifier 38, which thus carries out the simultaneous charging.

It is emphasized that, since the bit lines 32 of the redundant columns 34 are all charged at the same time through a single sense amplifier 38, they have voltages that increase more slowly than normally occurs when just a single bit line 32 is to be charged.

As soon as the discharging control signal PH switches to the high logic level again, only the conditioned addressing signal YCi of the redundant column 34 actually addressed continues to be kept at the high logic level (as indicated in FIG. 5 by the solid line), in that the corresponding addressing signal YMi is also at the high logic level, and enables charging of the corresponding bit line 32 to proceed, whilst the conditioned addressing signals YCi of the other non-addressed redundant columns 34 switch to the low logic level (as illustrated in FIG. 5 by the dashed line) and hence turn off the corresponding selection transistors 30 and control interruption of charging of the corresponding bit lines 32.

In addition, since the discharging control signal PH switches to the high logic level, the voltage VCR of the bit line 32 of the redundant column 34 actually addressed starts to increase faster than occurs when the discharging control signal PH is at the high logic level, in that the sense amplifier 38 must only charge that bit line 32.

FIG. 5 also illustrates, by a dashed line, the plot of the voltage VCR of the bit line 32 of the redundant column 34 addressed by means of an addressing circuit 2 of a known type.

From an examination of the characteristics of the addressing device 1' according to the present invention the advantages that this renders possible are evident.

Finally, it is clear that it is possible to make modifications and transitions to the addressing device 1' described and illustrated herein without thereby departing from the sphere of protection of the present invention.

For example, the memory array could comprise just one redundant column.

What is claimed is:

1. A method for addressing a redundant column in a nonvolatile memory receiving at inputs selection addresses, the redundant column including a bit line, the method comprising:

detecting a transition in said selection addresses;

starting charging of said bit line upon detection of said transition in the addresses;

detecting, after starting charging said bit line, whether said redundant column is addressed;

if said redundant column is addressed, continuing charging of said bit line; and if said redundant column is not addressed, stopping charging of said bit line.

2. A method for addressing redundant columns in a nonvolatile memory receiving at inputs selection addresses, each redundant column including a respective bit line, the method comprising:

detecting a transition in said selection addresses;

starting charging of all said bit lines upon detection of said transition in the addresses;

detecting, after starting charging of all said bit lines, whether one of said redundant columns is addressed;

if one of said redundant columns is addressed, continuing charging of the bit line of the redundant column addressed and interrupting charging of the bit lines of the redundant columns not addressed; and if none of said redundant columns is addressed, interrupting charging of all said bit lines.

3. A device for addressing a redundant column in a nonvolatile memory receiving at inputs selection addresses, the redundant column including a bit line, the device comprising:

charging means connected to said bit line and selectively activatable for charging the bit line;

first detecting means for detecting a transition in said selection addresses;

second detecting means for detecting whether said redundant column is addressed; and control means connected to said first and second detecting means and to said charging means for controlling start of charging of said bit line upon detection of said transition in said selection addresses, and subsequently controlling interruption of charging of said bit line should said redundant column not be addressed.

4. The device of claim 3 wherein the first detecting means include an output at which a detection signal is produced in response to detecting the transition in said selection addresses and said control means include a logic gate having a first input coupled to the output of the first detecting means.

5. The device of claim 4 wherein the charging means include a sense amplifier and a charging transistor coupled between the sense amplifier and the bit line and having a control terminal coupled to an output of the logic gate.

6. The device of claim 4, further comprising:

a discharge stage having a control input coupled to an output of the second detecting means and an output coupled to a common node, the discharge stage discharging the common node in response to a detection signal received from the second detecting means;

a storage stage that stores a value of a voltage at the common node; and a final addressing stage having a first input coupled to the storage stage, a second input coupled to the output of the first detecting means, and an output coupled to a second input of the logic gate.

7. The device of claim 6 wherein the logic gate includes a NAND gate and the control means further include an inverter coupled between the output of the final addressing stage and the second input of the logic gate.

8. The device of claim 7 wherein the charging means include a charging transistor coupled to the bit line and having a control terminal coupled to an output of the logic gate.

9. A device for addressing a plurality of redundant columns in a nonvolatile memory receiving at inputs selection addresses, each redundant column including a respective bit line, the device comprising:

charging means connected to said bit lines and selectively activatable for charging the bit lines independently from one another;

first detecting means for detecting a transition in said selection addresses;

second detecting means for detecting whether one of said redundant columns is addressed; and control means connected to said first and second detecting means and to said charging means for controlling start of charging of all said bit lines upon detection of said transition in the addresses and subsequently controlling interruption of charging of the bit lines of the non-addressed redundant columns.

10. The device of claim 9 wherein the first detecting means include an output at which a detection signal is produced in response to detecting the transition in said selection addresses and said control means include a logic gate having a first input coupled to the output of the first detecting means.

11. The device of claim 10, further comprising:

a discharge stage having a control input coupled to an output of the second detecting means and an output coupled to a common node, the discharge stage discharging the common node in response to a detection signal received from the second detecting means;

a storage stage that stores a value of a voltage at the common node; and a final addressing stage having a first input coupled to the storage stage, a second input coupled to the output of the first detecting means, and an output coupled to a second input of the logic gate.

12. The device of claim 11 wherein the logic gate includes a NAND gate and the control means further include an inverter coupled between the output of the final addressing stage and the second input of the logic gate.

13. The device of claim 11 wherein the charging means include a plurality of charging transistors each coupled to a respective one of the bit lines and having a control terminal and the control means includes a plurality of logic gates each having an input coupled to an output of the first detecting means and an output coupled to the control terminal of a respective one of the charging transistors.

14. A device for addressing a redundant column of a memory, the redundant column including a bit line, the device comprising:

an address transition detector for detecting a transition in an address directed to the memory, the address transition detector having an output that provides a transition detection signal that indicates the transition;

a charging switch connected between a charging voltage and the bit line and including a control terminal;

an address detector for detecting whether the redundant column is addressed by the address, the address detector having an output that indicates whether the redundant column is being addressed; and a control stage having a first input and a second input coupled to the outputs of the address transition detector and the address detector, respectively, and an output coupled to the control terminal of the charging switch, the control stage being structured to cause the charging switch to start charging the bit line upon detection of the address transition, and subsequently interrupt the charging of the bit line in response to receiving from the address detector an indication that the redundant column is not being addressed.

15. The device of claim 14 further comprising a sense amplifier coupled to a first conduction terminal of the charging switch which has a second conduction terminal coupled to the bit line.

16. The device of claim 14, further comprising:

a discharge stage having a control input coupled to the output of the address detector and an output coupled to a common node, the discharge stage discharging the common node in response to a detection signal received from the address detector;

a storage stage that stores a value of a voltage at the common node; and a final addressing stage having a first input coupled to the storage stage, a second input coupled to the output of the address transition detector, and an output coupled to the second input of the control stage.

17. The device of claim 16 wherein the control stage includes a NAND gate having a first input coupled to the output of the address transition detector, a second input, and an output coupled to the output of the control stage, the control stage further including an inverter coupled between the output of the final addressing stage and the second input of the NAND gate.

* * * * *